(12) United States Patent
Chang et al.

(10) Patent No.: US 7,022,571 B2
(45) Date of Patent: Apr. 4, 2006

(54) QUANTUM STRUCTURE AND FORMING METHOD OF THE SAME

(75) Inventors: Ting-Chang Chang, Hsin-Chu (TW); Po-Tsun Liu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 139 days.

(21) Appl. No.: 10/426,873

(22) Filed: May 1, 2003

(65) Prior Publication Data

US 2004/0219750 A1 Nov. 4, 2004

(51) Int. Cl.
*H01L 21/336* (2006.01)

(52) U.S. Cl. .................... 438/257; 438/316; 438/201; 438/264

(58) Field of Classification Search ............. 438/257, 438/315, 201, 264
See application file for complete search history.

(56) References Cited

U.S. PATENT DOCUMENTS

| | | | | |
|---|---|---|---|---|
| 6,054,349 A | * | 4/2000 | Nakajima et al. | 438/257 |
| 6,166,401 A | * | 12/2000 | Forbes | 257/77 |
| 6,285,055 B1 | * | 9/2001 | Gosain et al. | 257/317 |
| 6,342,716 B1 | * | 1/2002 | Morita et al. | 257/315 |
| 6,407,424 B1 | * | 6/2002 | Forbes | 257/315 |
| 6,656,792 B1 | * | 12/2003 | Choi et al. | 438/257 |
| 6,740,925 B1 | * | 5/2004 | Yoo et al. | 257/314 |
| 6,756,292 B1 | * | 6/2004 | Lee et al. | 438/591 |
| 6,774,061 B1 | * | 8/2004 | Coffa et al. | 257/E21.209 |
| 6,809,371 B1 | * | 10/2004 | Sugiyama | 257/314 |
| 6,815,763 B1 | * | 11/2004 | Osabe et al. | 257/324 |

\* cited by examiner

*Primary Examiner*—Luan Thai
(74) *Attorney, Agent, or Firm*—Nath & Associates PLLC; Harold L. Novick

(57) ABSTRACT

A quantum structure and the forming method based on the difference in characteristic of two matters is provided. The forming method includes several steps. At first, providing a first dielectric layer for forming a second dielectric layer thereon. The second dielectric layer has major elements and impurities contained. Treating the second dielectric layer to drive the impurities to form the quantum structure. For example, oxidizing the major elements to drive the impurities in the first dielectric layer to form the quantum structure in said first dielectric layer because the oxidizing capability of the major elements is stronger than that of the impurities.

15 Claims, 3 Drawing Sheets

QUANTUM STRUCTURE AND FORMING METHOD OF THE SAME

BACKGROUND OF THE INVENTION

1. Field of the Invention

The present invention relates to a quantum structure, and more particularly, to a forming method and a structure of a quantum structure according to the difference in characteristic between two matters.

2. Description of the Prior Art

The NVRAM (non-volatile random access memory) includes many good properties, e.g. little volume, low power consumption, and storing electrical charges by programing and erase. Many technological products depend on the function of NVRAM's to be operated.

A memory cells 1 is shown in FIG. 1*a*. A plurality of NVRAM 3, e.g. a plurality of Flash RAM, connect with different word lines 5 and bit lines 7, respectively. As shown in FIG. 1*b*, a profile of the NVRAM 3 is provided. A word line 5 connects to a control gate 12 of a NVRAM 3 and cooperates with a source 9 and a drain 11 to control a floating gate 13 for storing or erasing electrical charges by supplying voltage. The NVRAM 3 can program the floating gate 13 by injecting hot electron into the floating gate 13, and erase the electrical charges that are stored in the floating gate 13 by Fowler-Nordheim Tunneling; or programs and erases the floating gate 13 by Fowler-Nordheim Tunneling.

It is necessary to supply more than 5 volts, even 10 volts or 12 volts, no matter programing and erasing the floating gate 13 by Fowler-Nordheim Tunneling, or by injecting hot electron into the floating gate 13 in the prior art. High supplying voltage is the first disadvantage of the traditional NVRAM 3 (the Flash RAM). The second disadvantage of the NVRAM 3 is the uncertain product-life. The floating gate 13 cannot store electrical charges anymore if any portion of the dielectric layer 15 that is deposited between the floating gate 13 and a substrate 17 is broken by some reasons, e.g. programing and erasing the floating gate 13 thousand times. High difficulty for reducing the thickness of the dielectric layer 15 and the thickness of the NVRAM 3 is the third disadvantage of the NVRAM 3.

So that it is necessary to improve the disadvantages, i.e. the high supplying voltage, the uncertain product-life and high difficulty for reducing the thickness of the dielectric layer that is deposited between the floating gate and the substrate, of the NVRAM in the prior art.

SUMMARY OF THE INVENTION

According to the above description of the background of the invention, it is one objective of the present invention to provide a forming method and a structure of a quantum structure for improving the disadvantages of NVRAM.

It is another object of the present invention to provide a convenient method to form a quantum structure by original devices without buying or using any new devices.

It is a further objective of the present invention to provide a forming method and structure of a quantum structure to decrease the supplying voltage for programing and erasing the floating gate of a NVRAM.

It is a further objective of the present invention to provide a forming method and structure of a quantum structure for increasing the certainty of product-life of a NVRAM.

It is a further objective of the present invention to provide a forming method and structure of a quantum structure for reducing the thickness of the dielectric layer that is deposited between the floating gate and the substrate, and the whole thickness of a NVRAM.

The present invention providing a forming method and structure of a quantum structure according to several steps. Providing a first dielectric layer for forming a second dielectric layer, that has a plurality of major element and a plurality of impurity contained, thereon. Treating the second dielectric layer to drive the impurities to drive the impurities in the first dielectric layer to form the quantum structure in said first dielectric layer.

All these advantageous features as well as others that are obvious from the following detailed description of preferred embodiments of the invention are obtained.

DESCRIPTION OF THE PREFERRED EMBODIMENT

The preferred embodiments of the present invention that provides a forming method and a structure of a quantum structure according to the difference in characteristic between two matters is described below.

The method of forming a quantum structure in the present invention comprising several steps. At first, providing a first dielectric layer for forming a second dielectric layer thereon. The second dielectric layer has a plurality of major element and a plurality of impurity contained. Treating the second dielectric layer to drive the impurities to form the quantum structure. For example, oxidizing the major elements to drive the impurities in the first dielectric layer to form the quantum structure in said first dielectric layer because the oxidizing capability of the major elements is stronger than that of the impurities.

Figure 1A:
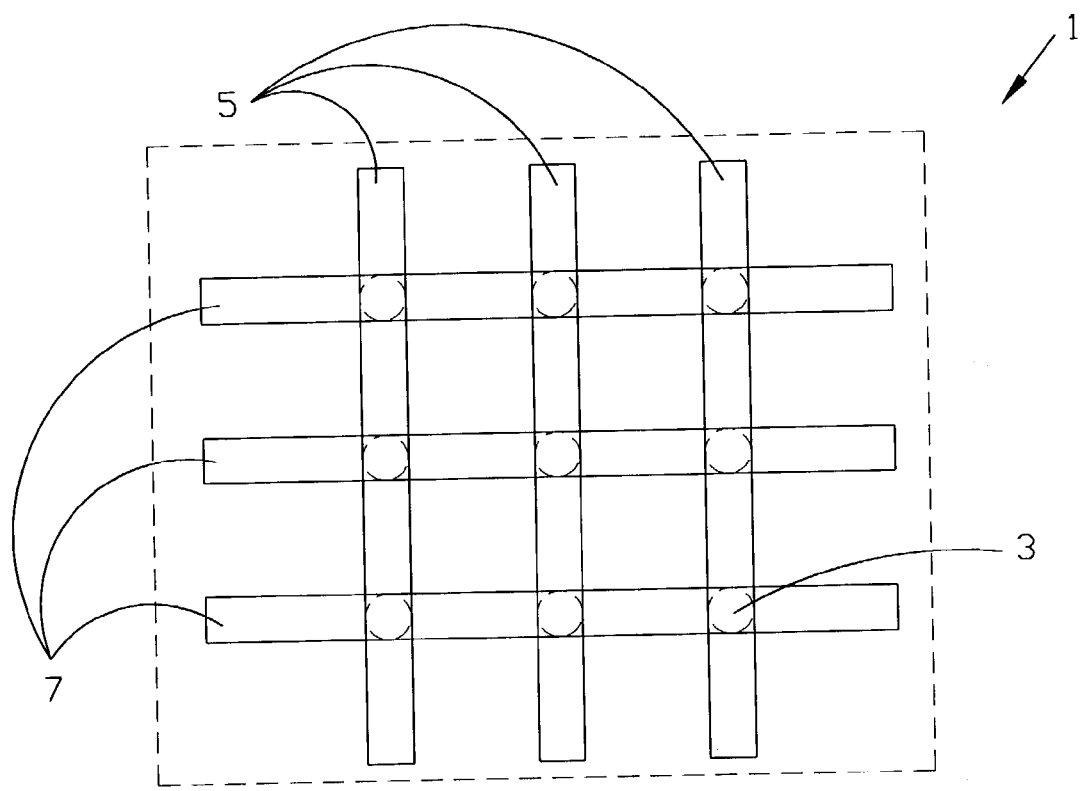
FIG. 1*a* is a view in the prior art.
Figure 1B:
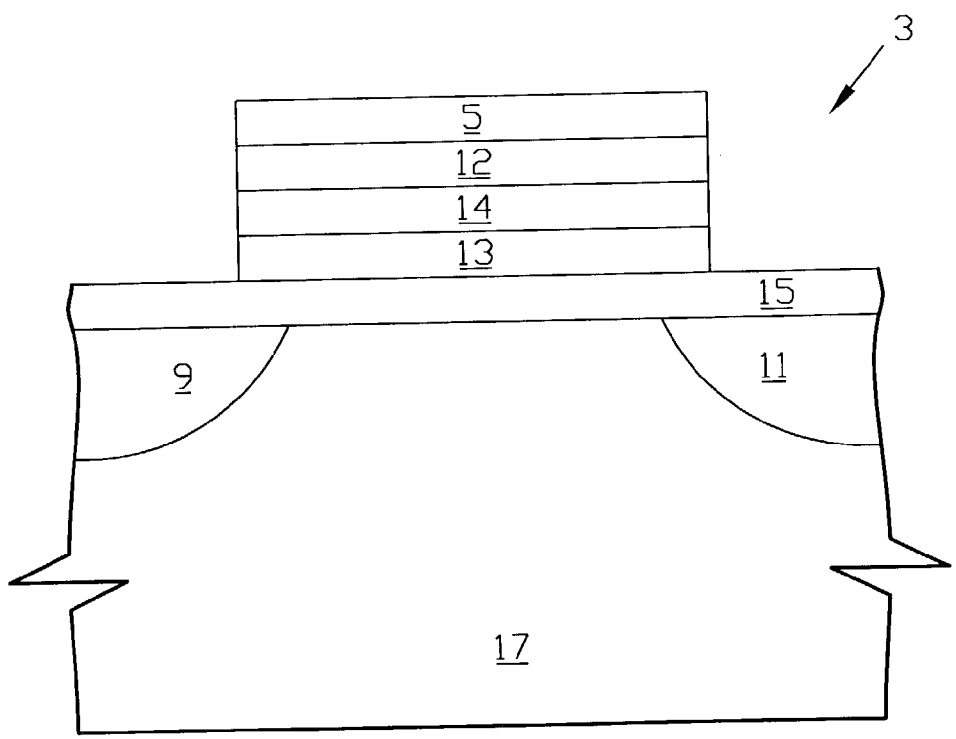
FIG. 1*b* is the profile in the prior art.
Figure 2A:
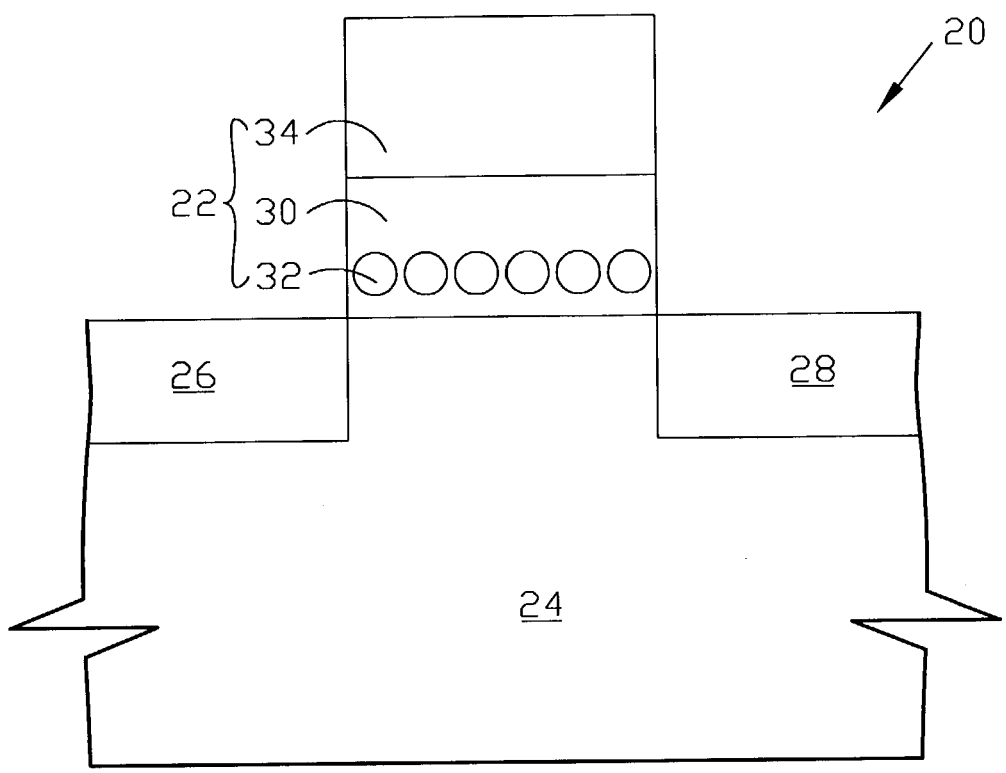
FIG. 2*a* is a profile of the of the first embodiment in the present invention.

As shown in FIG. 2*a*, the profile of a NVRAM 20 (non-volatile random access memory) of the first embodiment in the present invention is provided, when the present invention is used for improving disadvantages of the NVRAM. The NVRAM 20 includes a compound gate 22 formed on a semiconductor substrate 24, and a source 26 and a drain 28 formed within the semiconductor substrate 24. The compound gate 22 comprises a dielectric layer 30 formed on the semiconductor substrate 24, and a control gate 34 formed on the dielectric layer 30. The dielectric layer 30 includes quantum structure that is a plurality of quantum dots 32 in this embodiment for storing electrical charges as the floating gate in the prior art. These quantum dots 32 are formed from an oxidizing process that will be explained below.

In the first embodiment, the composition of the dielectric layer 30 is $SiO_2$ (silica), and the composition of the quantum dots 32 is Ge (germanium) atom. The control gate 34 is poly-silicon gate and the composition of the substrate 24 is Si.

Figure 2B:
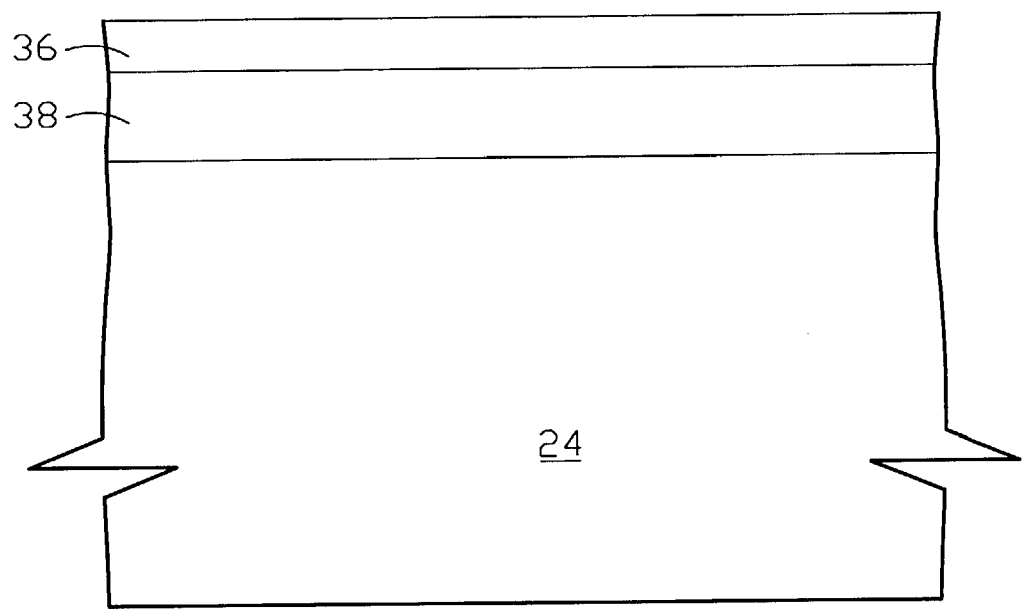
FIG. 2*b-d* are the flow diagrams of the first embodiment.
Figure 2C:
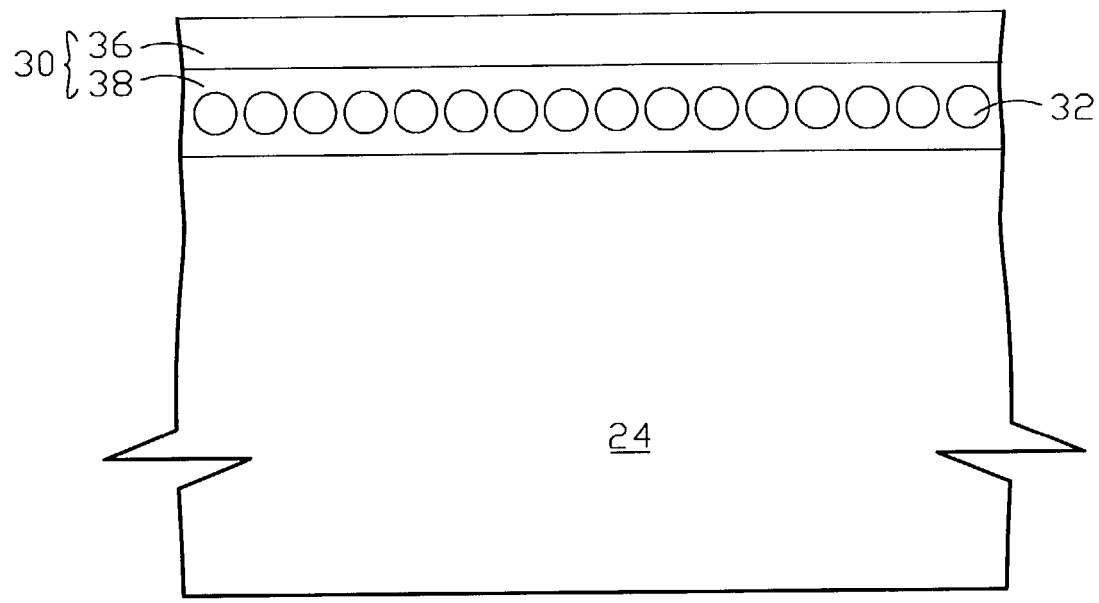
Figure 2D:
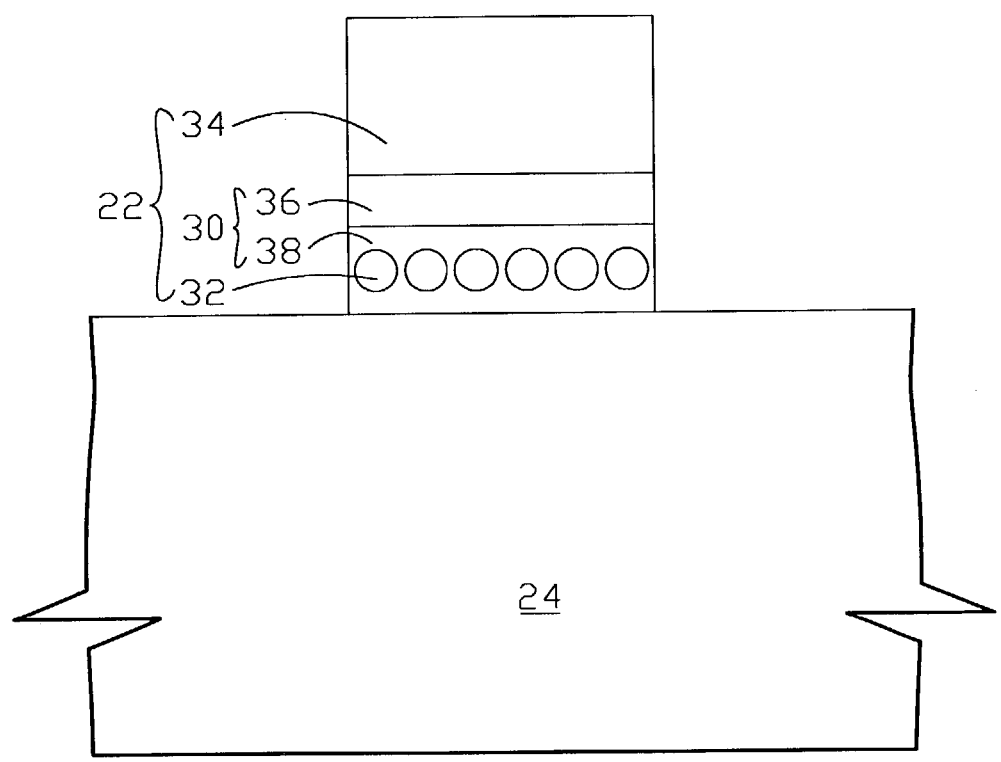

FIG. 2*b*, FIG. 2*c* and FIG. 2*d* are the method of forming NVRAM 20 of the first embodiment. A first dielectric layer 38, that is a silica layer, is deposited on the semiconductor substrate 24. The second dielectric layer 36 having a plurality of major element (not shown), e.g. Si atoms, and a plurality of impurity (not shown) contained, e.g. germanium atoms, is formed on the first dielectric layer 38. The oxidizing capability of Si atoms is stronger than that of Ge atoms, i.e., the oxidizing capability of the major elements is stronger than that of the impurities. The second dielectric layer 36 is a SiGe layer (silicon-germanium layer) in the first embodiment, and the SiGe layer is formed by UHVCVD (Ultra High Vacuum Chemical Vapor Deposition) with two kinds of gases—SiH$_4$ and GeH$_4$, according to the chemical formula (1):

$$SiH_4 + GeH_4 \rightarrow SiGe + 4H_2 \quad (1)$$

So that the first dielectric layer 38 is deposited between the second layer 36 and the semiconductor substrate 24 as shown in FIG. 2b. The first dielectric layer 38 is a SiO$_2$ layer in the present embodiment.

After forming the second layer 36 on the first dielectric layer 38, treating the second dielectric layer 36 to oxidize the major elements in an environment being full of oxygen to drive the Ge atoms of the second dielectric layer 36 to form the quantum structure. The Ge atoms are drove into the first dielectric layer 38 to form the quantum dots, because overwhelming majority of the Si atoms (major elements) oxidizing but overwhelming majority of the Ge atoms (impurities), that having weaker oxidizing capability, non-oxidizing. The dielectric layer 30 is composed of the first dielectric layer 38 and the second dielectric layer 36.

Depositing the controlling gate 34 on the second dielectric layer 36, and then etching the control gate 34, the second dielectric layer 36 and the first dielectric layer 38 in sequence according to a designed pattern of the compound gate 22, as shown in FIG. 2d. The compound gate 22 includes the control gate 34, the second dielectric layer 36 and the first dielectric layer 38. After finished the compound gate 22 on the substrate 24, forming the source 26 and the drain 28 within the substrate 24 to form the NVRAM 20.

Every quantum dot 32, which is formed by Ge, stores the electric charges as a floating gate does. Because the dimensions of every quantum dot 32 is within the nanometer (nm) scale, approximately between 1 nm and 5 nm, every quantum dot 32 may store few electric charges, e.g. one or two electric charges, due to the Coulomb blockade. So that programing the electric charges into, or erasing the electric charges from, the quantum dots 30 needs low voltage, i.e. 2.5 volts, in the present invention. Of course, controlling the amount of the impurities in the second dielectric layer 36 to control the quantum dots 32 in dimension is a way for procuring different purposes.

The second dielectric layer 36 including a plurality of oxygen atom, a plurality of major element, e.g. Si atoms, and a plurality of impurity contained, e.g. germanium atoms, is formed on the first dielectric layer 38, as the second embodiment in the present invention. The first dielectric layer 38, preferred to be a silica layer, is deposited on the semiconductor substrate 24. The oxidizing capability of Si atoms is stronger than that of Ge atoms, i.e. the oxidizing capability of the major elements is stronger than that of impurities. The second dielectric layer 36 is a SiGeO$_2$ layer in the second embodiment, and the SiGeO$_2$ layer is formed by UHVCVD (Ultra High Vacuum Chemical Vapor Deposition) with three kinds of gases—O$_2$, SiH$_4$ and GeH$_4$, according to the chemical formula (2):

$$SiH_4 + GeH_4 + O_2 \rightarrow SiGeO_2 + 4H_2 \quad (2)$$

The first dielectric layer 38 is deposited between the second dielectric layer 36 and the semiconductor substrate 24 as shown in FIG. 2b.

Then, increasing the temperature of the second dielectric layer 36 for oxidizing the major elements, that are Si atoms, in an environment being without oxygen, e.g. the environment being full of N$_2$, and then annealing the second dielectric layer 36 to drive the Ge atoms to form the quantum dots. The Ge atoms are drove into the first dielectric layer 38 to form the quantum atoms, because overwhelming majority of the Si atoms (major elements) oxidizing with the oxygen atoms of the second dielectric layer 36 but overwhelming majority of the Ge atoms (impurities), that having weaker oxidizing capability, non-oxidizing. The dielectric layer 30 is composed of the first dielectric layer 38 and the second dielectric layer 36.

Similarly, the second embodiment in the present invention depositing the controlling gate 34 on the second dielectric layer 36 after forming the quantum dots 32 in the first dielectric layer 38. Then, etching the control gate 34, the second dielectric layer 36 and the first dielectric layer 38 in sequence according to a designed pattern of the compound gate 22. As the first embodiment, the compound gate 22 includes the control gate 34, the second dielectric layer 36 and the first dielectric layer 38. After finished the compound gate 22 on the substrate 24, forming the source 26 and the drain 28 within the substrate 24 to form the NVRAM 20.

In the second embodiment, every quantum dot 32 stores the electric charges as a floating gate does. Every quantum dot 32 may store few electric charges, e.g. one or two electric charges, due to the Coulomb blockade, because the dimensions of every quantum dot 32 is within the nanometer (nm) scale. When programing the electric charges into, or erasing the electric charges from, the quantum dots needs lower voltage than 5V. Of course, in the second embodiment, controlling the amount of the impurities in the second dielectric layer 36 to control the quantum dots 32 in dimension is a way for procuring different purposes.

The present invention programing and erasing the floating gate (quantum dots 32) of the NVRAM 20 with lower supplying voltage than the supplying voltage of the traditional NVRAM 3 in the prior art, because every quantum dot 32 stores few electric charges, e.g. one or two electric charges.

The NVRAM 20 having the more certainty of product-life in the present invention than the NVRAM 3 has in the prior art. If the dielectric layer 30 between some of the quantum dots 32 and the substrate 24 is broken by some reasons, e.g. programing and erasing the quantum dots 32 thousand times, other quantum dots 32 still store electric charges due to that each quantum dots 32 stores electrical charges respectively. So that the product-life of the NVRAM 20 maintains due to the stored electric charges inside the working quantum dots 32 in the present invention.

The present NVRAM 20 has a thinner thickness than the prior NVRAM 3, because the quantum dots 32 replace the floating layer 13 so that the thickness of the present NVRAM 20 can decrease the thickness of the floating layer 13 in the prior art. Besides, the thickness of the portion of the dielectric layer 30 that is deposited between the quantum dots 32 and the substrate 24 is thinner than the dielectric layer 15.

The preferring embodiments in the present invention improve disadvantages of the NVRAM's, but the feature of the present invention is a forming method and a structure of a quantum structure. So that the scope of the present invention is not admitted to be prior art of the NVRAM's with respect to the present invention by its mention in the Background of the Invention section.

The described above is only to demonstrate and illustrate the preferred embodiments of the present invention, not to limit the scope of the present invention to what described detailed herein; and any equivalent variations and modifications in the present invention should be within the scope of the claims hereafter.

What is claimed is:

1. A method of forming a quantum structure, comprising:
   providing a substrate;
   forming a first dielectric layer on said substrate;
   forming a second dielectric layer having a plurality of major element and a plurality of impurity on said first dielectric layer by a chemical vapor deposition process, wherein the oxidizing capability of said major elements is stronger than that of said impurities;
   driving said impurities of said second dielectric layer to form said quantum structure in said first dielectric layer; and
   forming a control gate on said second dielectric layer.

2. The method according to claim 1, wherein said major elements are silicon atoms or the material that is consisted by the chemical compound of silicon atoms.

3. The method according to claim 2, wherein said impurities are germanium atoms.

4. The method according to claim 1, wherein said impurities are germanium atoms.

5. The method according to claim 1, wherein forming said second dielectric layer comprises forming a SiGe layer.

6. The method according to claim 1, wherein driving said impurities comprises oxidizing said major elements in an environment that is full of oxygen to drive said impurities to form said quantum structure in said first dielectric layer.

7. The method according to claim 1, wherein forming said second dielectric layer comprises forming a layer that includes oxygen atoms.

8. The method according to claim 7, wherein forming said second dielectric layer comprises forming a $SiGeO_2$ layer.

9. The method according to claim 7, wherein driving said impurities comprises oxidizing said major elements with said oxygen atoms of said second dielectric layer in an environment without oxygen to drive said impurities to form said quantum structure in said first dielectric layer.

10. The method according to claim 9, wherein driving said impurities of said second dielectric layer further comprises thermal annealing said second dielectric layer in said environment without oxygen.

11. The method according to claim 1, wherein said quantum structure is approximately 1–5 nm in dimension.

12. The method according to claim 1, wherein said semiconductor substrate includes a source and a drain.

13. The method according to claim 1, further comprising controlling the amount of said impurities in said second dielectric layer to control said quantum structure in dimension.

14. A method of forming a quantum structure, comprising:
    providing a semiconductor substrate and a first dielectric layer thereon;
    forming a SiGe layer on said first dielectric layer; and
    treating said SiGe layer in an environment, that is full of oxygen, to oxidize said Si atoms and drive said Ge atoms of said SiGe layer in said first dielectric layer to form said quantum structure.

15. A method of forming a quantum structure, comprising:
    providing a semiconductor substrate and a first dielectric layer thereon;
    forming a $SiGeO_2$ layer on said first dielectric layer by a chemical vapor deposition process;
    and treating said $SiGeO_2$ layer in an environment without oxygen, to oxidize said Si atoms with said oxygen atoms of said $SiGeO_2$ layer and driving said Ge atoms of said $SiGeO_2$ layer in said first dielectric layer to form said quantum structure.

* * * * *